(12) United States Patent
Sukekawa et al.

(10) Patent No.: US 6,544,840 B2
(45) Date of Patent: Apr. 8, 2003

(54) SEMICONDUCTOR MEMORY DEVICE AND MANUFACTURING METHOD AND MASK DATA PREPARING METHOD FOR THE SAME

(75) Inventors: Mitsunari Sukekawa, Tokyo (JP); Takeshi Watanabe, Tokyo (JP); Akira Hoshino, Tokyo (JP); Masayuki Hamada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/086,884

(22) Filed: Mar. 4, 2002

(65) Prior Publication Data

US 2002/0079529 A1 Jun. 27, 2002

Related U.S. Application Data

(62) Division of application No. 09/545,886, filed on Apr. 7, 2000.

(30) Foreign Application Priority Data

Apr. 7, 1999 (JP) .............................. 11-100694

(51) Int. Cl.[7] ........................................... H01L 21/8234
(52) U.S. Cl. ....................................... 438/253; 438/241
(58) Field of Search ................ 438/239–254, 438/396–398; 257/295–310

(56) References Cited

U.S. PATENT DOCUMENTS

| 5,155,056 | A |   | 10/1992 | Jeong-Gyoo |
| 5,317,193 | A |   | 5/1994 | Watanabe |
| 5,691,223 | A |   | 11/1997 | Pittikoun et al. |
| 5,780,334 | A |   | 7/1998 | Lim et al. |
| 5,874,756 | A |   | 2/1999 | Ema et al. |
| 5,990,510 | A |   | 11/1999 | Choi et al. |
| 6,057,571 | A |   | 5/2000 | Miller et al. |
| 6,072,210 | A | * | 6/2000 | Choi ........................... 257/303 |
| 6,117,725 | A | * | 9/2000 | Huang ......................... 438/241 |
| 6,184,079 | B1 |  | 2/2001 | Lee |
| 6,329,681 | B1 | * | 12/2001 | Nakamura et al. .......... 257/297 |

FOREIGN PATENT DOCUMENTS

| JP | 3-167874 | 7/1991 |
| JP | 405102264 A | 4/1993 |
| JP | 8-222709 | 8/1996 |
| JP | 10-189895 | 7/1998 |
| JP | 10-242418 | 9/1998 |
| JP | 11-15129 | 1/1999 |
| JP | 411017141 A | 1/1999 |

OTHER PUBLICATIONS

Korean Office Action dated Mar. 30, 2002 with partial English translation.
European Serach Report dated Mar. 23, 2001.
Japanese Office Action dated Dec. 18, 2001 and partial English translation.

* cited by examiner

Primary Examiner—Cuong Quang Nguyen
(74) Attorney, Agent, or Firm—McGinn & Gibb, PLLC

(57) ABSTRACT

A semiconductor memory device includes a capacitive insulating film and an upper electrode formed at the inner surface of the cylindrical lower electrode to form a capacitive cell. Near the capacitive cell, a groove with the same depth as that of the capacitive cell is formed and electric conductive layers are formed at the inner surface thereof. The electric conductive layer and upper electrode are connected by the upper electrode extending part. At the bottom of the groove, the upper electrode contact is connected to the electric conductive layer.

6 Claims, 6 Drawing Sheets

SEMICONDUCTOR MEMORY DEVICE AND MANUFACTURING METHOD AND MASK DATA PREPARING METHOD FOR THE SAME

The present Application is a Divisional Application of U.S. patent application Ser. No. 09/545,886, filed on Apr. 7, 2000.

BACKGROUND OF THE INVENTION

1. Field of the Invention

The present invention relates to a semiconductor memory device such as DRAM (Dynamic Random Access Memory) having so-called cylinder shaped capacitive electrodes whose lower electrodes are cylindrical, and a manufacturing method and a mask data preparing method for the same.

2. Background of the Invention

FIG. 1 is a sectional view showing the structure of a prior-art DRAM having cylindrical capacitive electrodes. At the surface of the semiconductor substrate, a first electric conductive impurity range 1 is formed, and diffusion layer 2 is formed within the impurity range 1. Furthermore, above the impurity range 1 and diffusion layer 2, gate electrode 3 and gate electrodes 4 are formed, and furthermore, on the entire surface, interlayer insulation film 5 is formed. On this interlayer insulation film 5, wiring layer 6 is formed. In the peripheral range of the DRAM, contacts 7 each having a great aspect ratio are formed within the interlayer insulation film 5, and by these contacts 7, connections between the impurity range 1 and wiring layer 6 and between the gate electrode 3 and wiring layer 6 are made. Also, metal barriers 8 are formed at the side surfaces and bottom surfaces of the contacts 7.

On the other hand, in the DRAM range, lower electrodes 10 each having a bottom and a cylindrical shape are formed so as to be embedded within the interlayer insulation film 5, and at the inner surfaces of the lower electrodes 10, thin capacitive insulating films 11 are formed. Furthermore, upper electrodes 12 are formed so as to fill the inside of the lower electrodes, and upper electrodes 12 extend in parallel to the substrate surface to form extending parts 13 of the upper electrodes. The bottom surfaces of the lower electrodes and impurity range 1 are connected by contacts 25, and at both sides of each contact 25, gate electrodes 4 are formed. Thereby, cylindrical capacitive cells are formed of the upper electrodes 12, capacitive insulating films 11, and lower electrodes 10.

And, between a pair of capacitive cells in the DRAM range, contact 20 is disposed. This contact 20 penetrates the interlayer insulation film 5 in the direction of the thickness, and electrically connects the upper wiring layer 6 and the impurity range 1 on the substrate. Also, at the side surface of the contact 20, metal barrier 21 is formed.

Also, between extending part 13 of the upper electrode 12 and the upper wiring layer 6, contact 22 is formed, and metal barrier 23 is also formed at the side surface of this contact 22. These contacts 20 and 22 are formed by embedding Cu metal plugs 20b and 22b into contact holes 20a and 22a after the contact holes 20a and 22a are etched in the interlayer insulation film 5.

In the prior-art DRAM memory device arranged as mentioned above, the wiring layer 6 connected to the contact 20 functions as a bit line, and the gate electrode 4 functions as a word line. And, in a condition where the bit line is selected, when the word line (gate electrode 4) of one of the two capacitive cells is caused to become high, an electrical charge is extracted from the capacitive cell, whereby the data is read.

FIG. 2 is a sectional view showing the structure of another prior-art DRAM having cylindrical capacitive electrodes. In FIG. 2, the same components as in FIG. 1 are attached with the same symbols, and detailed description thereof is omitted. As shown in FIG. 2, in this prior-art, side wall insulating films 26 are formed at the side surfaces of the contacts 20, 22, and 25. The prior-art DRAM shown in FIG. 1 has a problem in that a short circuit easily occurs between the contact 20 and extending part 13 extending sideward from the upper electrode 12. Therefore, in the prior-art shown in FIG. 2, by providing side wall insulating film 26 at the side surfaces of the contact, a short circuit between the contact and the other electric conductive portion is prevented.

However, due to this arrangement, in the prior-art shown in FIG. 2, contact between the upper electrode 12 (extending part 13) and contact 22 cannot be made at the side surface of the contact 22. Therefore, in this prior-art, a groove similar to the capacitive cell is formed in the interlayer insulating film 5 immediately under the upper electrode contact 22, and at the same time when forming the lower electrode 10, the same electric conductive substance is inserted and adhered into this groove to form electric conductive layer 27, and furthermore, at the same time when forming the upper electrode 12, the same electric conductive substance is inserted and adhered to form electric conductive layer 28, whereby the electric conductive substance is embedded and filled into the groove. Thereby, electrical contacts between the bottom surface of the contact 22 and electric conductive layers 27 and 28 are made.

Also, conventionally, the capacitive cells are disposed at a high density and high integration degree, and around these capacitive cells, contacts to be connected to the upper wiring extending from the upper electrode are provided. Such a designing of a mask for the contacts of the upper electrode extending parts is automatically made by using a CAD tool by taking the lower layer and surrounding layout margins into account, and mask data is generated. In this case, the contact positions can be determined only by providing margins so as to prevent short circuits between said contacts and the surrounding capacitive cells, other wiring, and contacts.

However, the above-mentioned prior-art DRAM memory device has the following defects. That is, in both memory devices of FIG. 1 and FIG. 2, the contacts 20 to draw the potentials of the lower electrodes 10 to the outside and the contacts 22 to draw the potentials of the upper electrodes 12 to the outside are different in aspect ratio from each other. Therefore, at the contacts 22, penetration due to etching occurs, or control of the film thickness of the metal barriers 24 to be formed at the bottom of the contact holes becomes difficult.

FIG. 3 is a graph wherein the horizontal axis shows aspect ratios, and the vertical axis shows etching rates, which shows the relationship between the etching rates and aspect ratios of the $SiO_2$ film and polysilicon film, and the relationship between the $SiO_2$/polysilicon selecting ratios and aspect ratios. The extending part 13 of the upper electrode 12 is normally formed from polysilicon, and the thickness thereof is approximately 1000 Å, and the interlayer insulation film 5 is normally formed from $SiO_2$, and thickness thereof is approximately 3 µm. Also, the aspect ratio of the upper electrode contact 22 is approximately 1, and the aspect ratio of the lower electrode contact 20 is approximately 10. Then, as clearly understood from FIG. 3, if the contact holes 20a and 20b are formed in the same process, due to the difference in etching rate between them, both contact holes 20a and 22a are completed in about 4 minutes.

However, even if the etching selecting ratios differ, in the prior-art DRAM, since the aspect ratio is greatly different between the contact 20 and contact 22, in a case where the contact hole 20a and contact hole 22a are formed in the same etching process, the contact hole 22a may penetrate the extending part 13 of the upper electrode 12 as shown in FIG. 1. If so, as shown in FIG. 2, when side wall insulating film 26 is formed at the side surface of the contact hole 22a, electrical contact cannot be made with the extending part at the side surface of the contact 22. Therefore, as shown in FIG. 2, electric conductive layers 27 and 28 must be formed at the lower part of the contact 22.

Also, after the contact holes 20a and 22a are formed by means of etching, metal barriers 21 and 23 are formed at the inner surfaces thereof, however, since the aspect ratio greatly differs between the contact holes 20a and 22a, the film thicknesses of the metal barriers formed in the inner surfaces of the holes are difficult to control, and as shown in FIG. 1, at the contact 22, a thick metal barrier 24 may be formed at the bottom. If so, even when the bottom surface of the contact hole 22 is within the extending part 13, contact resistance between the contact 22 and extending part 13 greatly changes, whereby stable contact resistance cannot be obtained. Also, in the case of the contact 22 having the side wall insulating film 26 shown in FIG. 2, since it can be electrically contacted with the extending part 13 at the bottom section, it is a certain that the thick metal barrier 24 at the bottom of the contact cause unstable contact resistance.

SUMMARY OF THE INVENTION

It is an object of the present invention to provide a reliable semiconductor memory device and a manufacturing method for the same whereby unstable contact resistance and the penetration of the contact hole in the memory cell having a so-called cylinder shape can be prevented.

The semiconductor memory device according to the present invention comprises an interlayer insulation film, cylindrical lower electrodes formed within the interlayer insulation film, capacitive insulating films formed at the inner surfaces of the lower electrodes, upper electrodes formed so as to oppose the lower electrodes which sandwich the capacitive insulating films, cylindrical grooves formed within the interlayer insulation film, electric conductive layers formed at the inner surfaces of the grooves, upper electrode extending parts connecting the upper electrodes and electric conductive layers, upper electrode contacts formed at the interlayer insulation film and connected to the electric conductive layers at the bottom of the grooves, and upper electrode wiring formed on the interlayer insulation film and connected to the upper electrode contacts.

Another semiconductor memory device according to the present invention comprises a semiconductor substrate, a diffusion layer formed on the surface of the semiconductor substrate, an interlayer insulation film formed on the semiconductor substrate, cylindrical lower electrodes formed within the interlayer insulation film and connected to the diffusion layer, capacitive insulating films formed at the inner surfaces of the lower electrodes, upper electrodes formed so as to oppose the lower electrodes by sandwiching the capacitive insulating films, cylindrical grooves formed within the interlayer insulation film, electric conductive layers formed at the inner surfaces of the grooves, upper electrode extending parts connecting the upper electrodes and electric conductive layers, upper electrode contacts formed at the interlayer insulation film and connected to the electric conductive layers at the bottom of the grooves, upper electrode wiring formed on the interlayer insulation film and connected tot he upper electrode contacts, and a peripheral contact formed within the interlayer insulation film and connected tot he diffusion layer.

This semiconductor memory device can be arranged so as to comprise the lower electrode contacts formed so as to penetrate the interlayer insulation film, word line gate electrodes provided between the connection parts of the lower electrodes and lower electrode contacts on the surface of the diffusion layer, and lower electrode wiring formed on the interlayer insulation film and connected to the lower electrode contacts, or can be arranged so as to comprise lower electrode wiring formed lower than the lower electrodes in the interlayer insulation film, and lower electrode contacts formed at the interlayer insulation film to connect the lower electrode wiring and diffusion layer.

Also, side wall insulating films are formed at the side surfaces of the upper electrode contacts and lower electrode contacts, and at the bottom surfaces and side surfaces of the upper electrode contacts and lower electrode contacts, metal barrier layers are formed.

The manufacturing method for semiconductor memory device according to the present invention comprises the steps of forming a diffusion layer and gate electrode on the surface of a semiconductor substrate, forming an interlayer insulation film on the surface of the semiconductor substrate, simultaneously forming capacitive cell grooves and upper electrode contact grooves in the interlayer insulation film forming electric conductive substances on the bottom surfaces and side surfaces of the capacitive cell grooves and upper electrode contact grooves to form lower electrodes and a first electric conductive layer, forming capacitive insulating films on the inner side surfaces and bottom surfaces of the lower electrodes of the capacitive cell grooves forming electric conductive substances in the capacitive cell grooves and upper electrode contact grooves to form upper electrodes and a second electric conductive layer, and simultaneously forming upper electrode extending parts connecting the upper electrodes and second electric conductive layer, embedding insulation substances in the upper electrode contact grooves, simultaneously forming upper electrode contact holes and lower electrode contact holes at the insulation substances in the upper electrode contact grooves and interlayer insulation film, and embedding electric conductive substances in the upper electrode contact holes and lower electrode contact holes to form upper electrode contacts and lower electrode contacts.

Another manufacturing method for a semiconductor memory device according to present invention comprises the steps of forming a diffusion layer and gate electrodes on the surface of a semiconductor substrate, forming a first interlayer insulation film on the surface of the semiconductor substrate, forming lower electrode contacts at the first interlayer insulation film, and forming upper electrode wiring on the first interlayer insulation film, forming a second interlayer insulation film on the first interlayer insulation film, simultaneously forming capacitive cell groove and upper electrode contact grooves in the second interlayer insulation film, forming electric conductive substances at the bottom surfaces and side surfaces of the capacitive cell grooves and upper electrode contact grooves to form lower electrodes and a first electric conductive layer, forming capacitive insulating films on the inner surfaces and bottom surfaces of the lower electrodes of the capacitive cell grooves, embedding electric conductive substances into the capacitive cell grooves to form upper electrodes, forming electric conductive substances in the upper electrode contact grooves to form a second electric conductive layer, and simultaneously forming upper electrode extending parts connecting the upper electrodes and the second electric conductive layer, embedding insulation substances into the upper electrode contact grooves, forming upper electrode contact holes in the insulation substances in the upper electrode contact grooves, and embedding electric conductive substances into the upper electrode contact holes to form upper electrode contacts.

In the mask data preparing method and layout method of a semiconductor memory device according to the present invention, by determining the product of the upper electrode contact data and upper electrode extending parts, a step for extracting only the upper electrode contact data formed on the upper electrode extending parts from the upper electrode contact data is carried out. Next, the extracted upper electrode contact data is added to groove data to prepare cylinder data of the upper electrode extending parts, and the increased data is disposed with a margin so as not to be contacted by the surrounding wiring.

The foregoing and other features and advantages of the present invention will become more readily more appreciated as the same becomes better understood by reference to the following detailed description when taken into conjunction with the accompanying drawings.

DETAILED DESCRIPTION OF THE PREFERRED EMBODIMENTS

Figure 1:
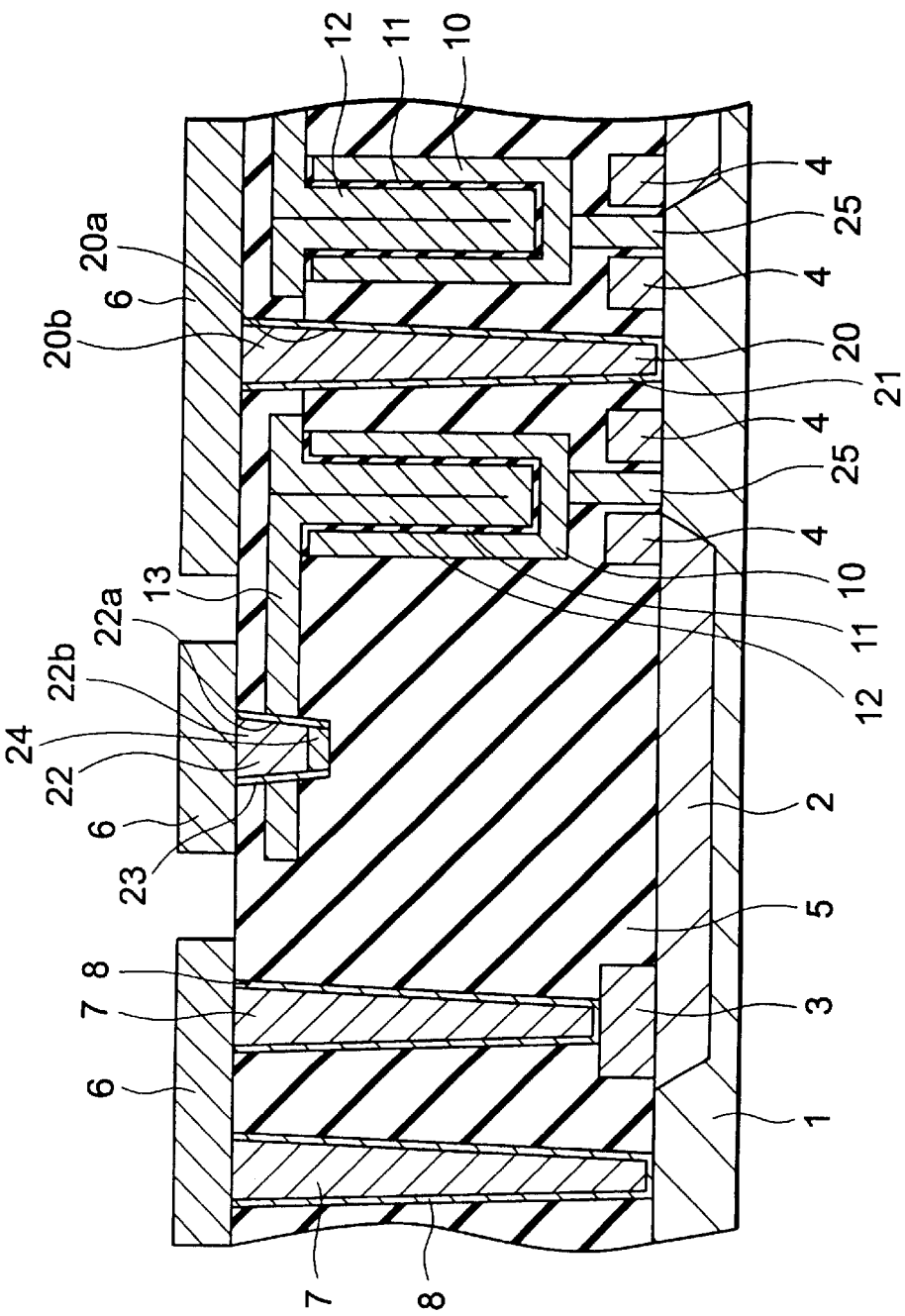
FIG. 1 is a sectional view showing a prior-art semiconductor memory device.
Figure 2:
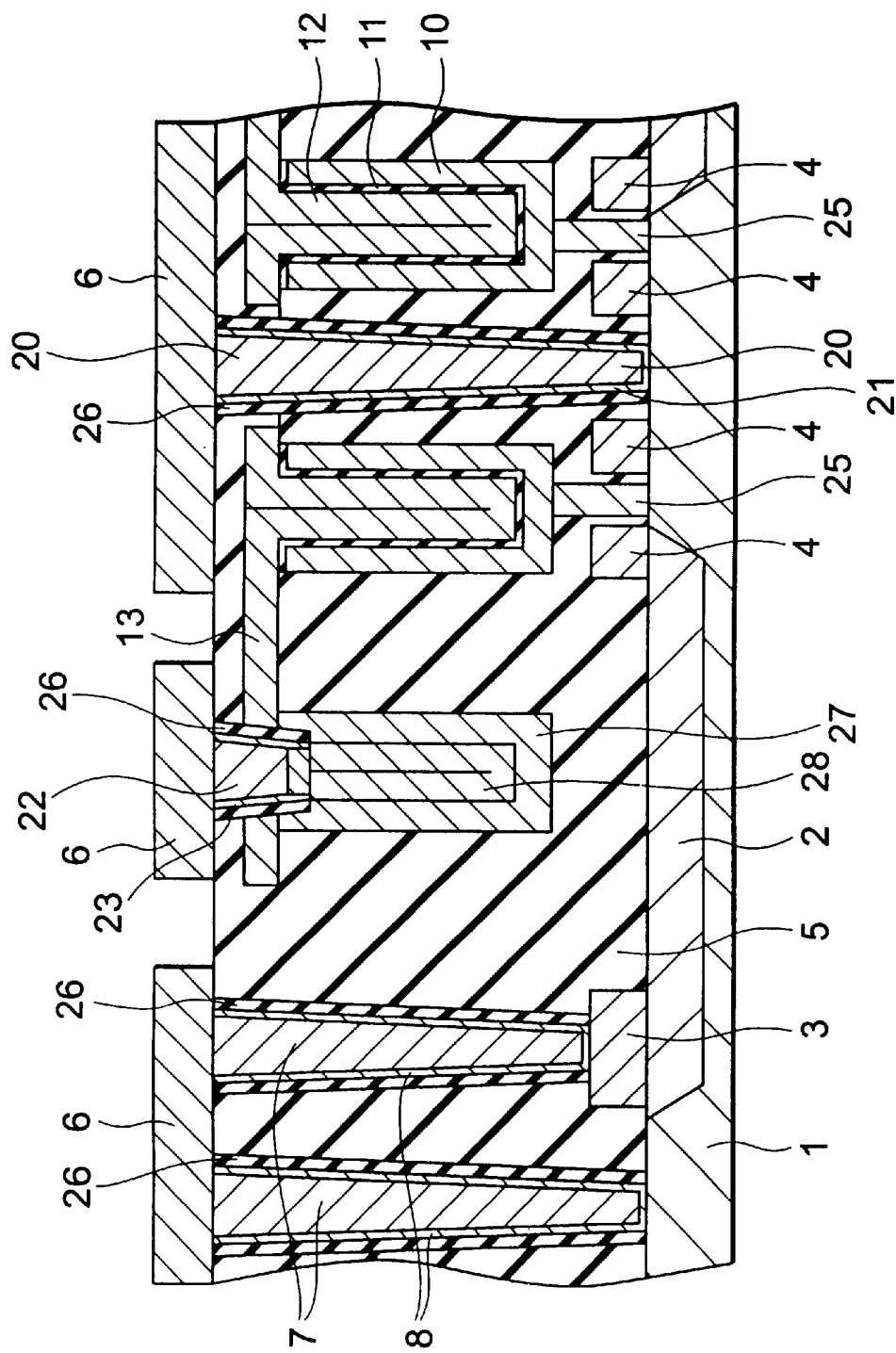
FIG. 2 is a sectional view showing another prior-art semiconductor memory device.
Figure 3:
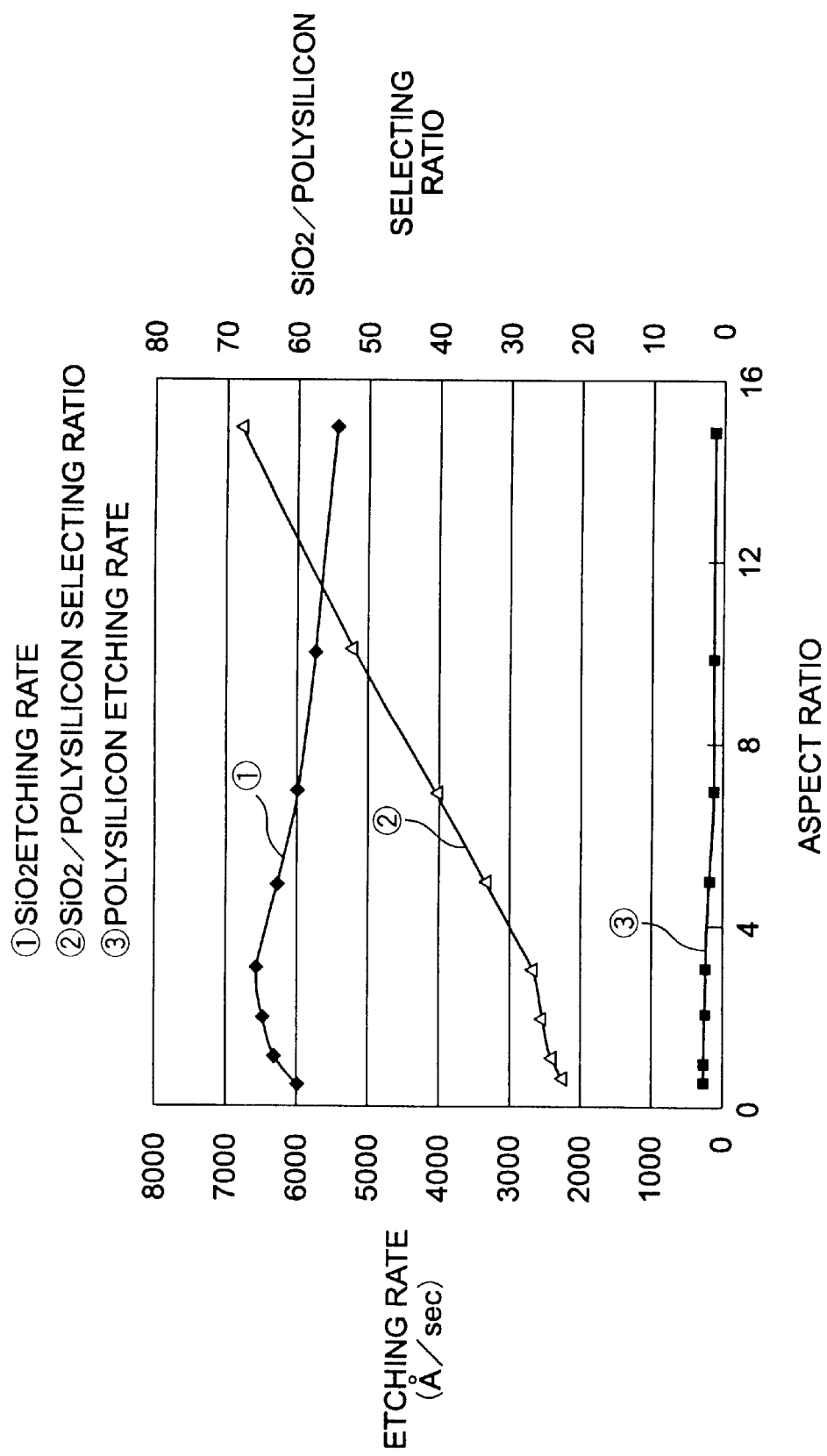
FIG. 3 is a graph in which the horizontal axis shows the aspect ratios, and the vertical axis shows etching rates and $SiO_2$/polysilicon selecting ratios, whereby relationships between the etching rates of the $SiO_2$ film and polysilicon film and $SiO_2$/polysilicon selecting ratios, and the aspect ratios.
Figure 4:
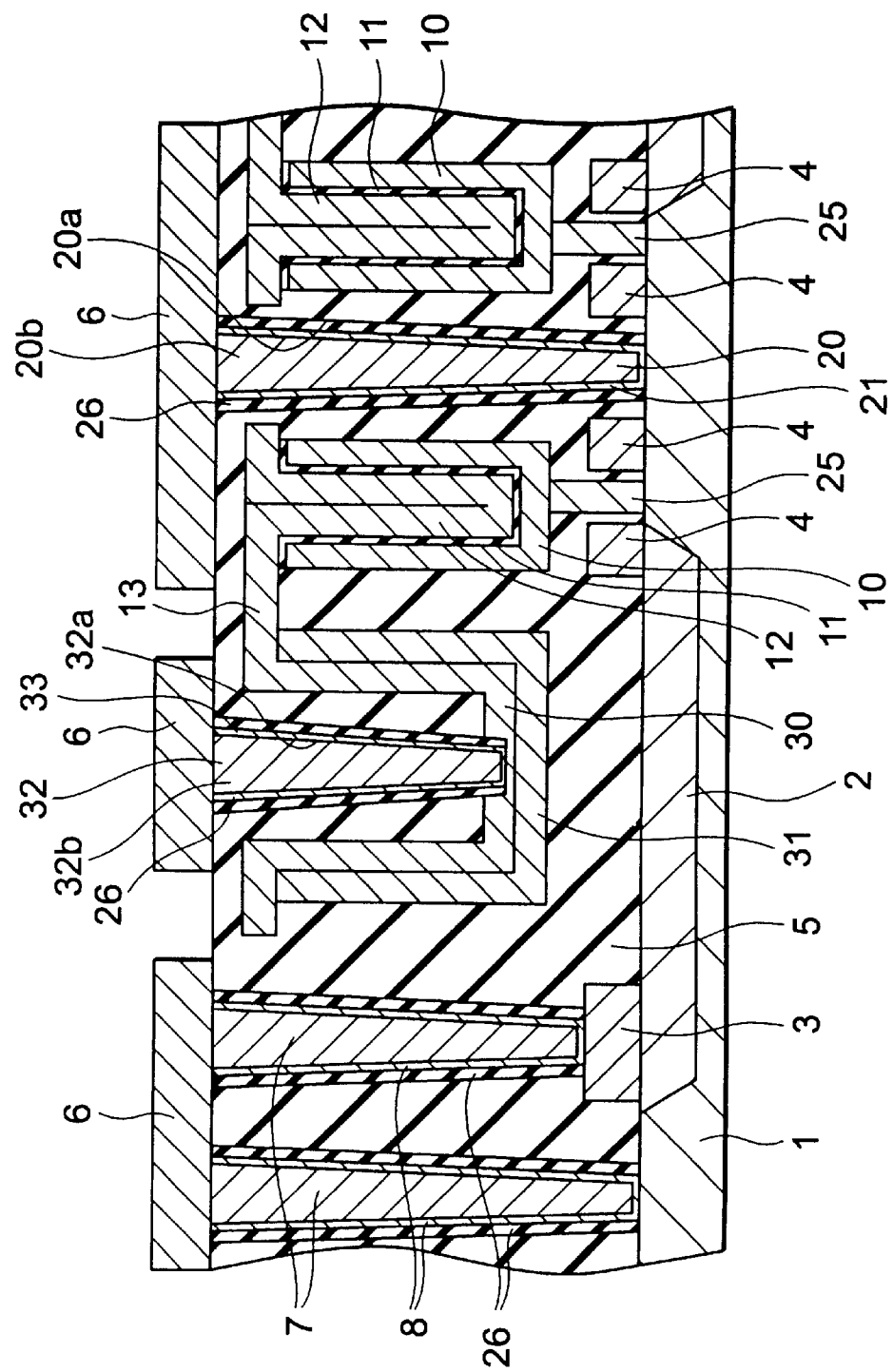
FIG. 4 is a sectional view showing the semiconductor memory device relating to the first embodiment of the invention.

Hereinafter, the embodiments of the invention shall be described with reference to the attached drawings. FIG. 4 is a sectional view showing a portion including two capacitive cells of the DRAM device relating to the first embodiment of the invention. On the surface of the semiconductor substrate, first electric conductive type impurity range 1 is formed, and within this impurity range 1, diffusion layer 2 is formed. Then, on the impurity range 1 and diffusion layer 2, gate electrode 3 and gate electrodes 4 are formed, and furthermore, interlayer insulation films 5 is formed on the entire surface, and on the interlayer insulation film 5, wiring layer 6 is formed. Also, in the peripheral range of the DRAM, contacts 7 each having a great aspect ratio are formed within the interlayer insulation film 5, and by the contacts 7, connections between the impurity range 1 and wiring layer 6 and between the gate electrode 3 and wiring layer 6 are made. At the side surfaces of metal plugs comprising the contacts 7, metal barriers 8 and side wall insulating films 26 are formed.

On the other hand, in the DRAM range, the contact 20 connecting the wiring layer 6 on the interlayer insulation film 5 and impurity range 1 is formed, and a pair of cylindrical capacitive cells are formed so as to sandwich the contact 20. That is, lower electrodes 10 each having a bottom surface and a cylindrical shape are formed so as to be embedded within the interlayer insulation film 5, and at the inter surfaces of the lower electrodes 10, thin capacitive insulating films 11 are formed. Furthermore, upper electrodes 12 are formed so as to fill the inside of the lower electrodes 10, and upper electrode extending part 13 is formed so as to extend from the upper end of the upper electrode 12 in parallel to the substrate surface. The bottom surfaces of the lower electrodes 10 and impurity range 1 are connected by contacts 25, and at both sides of each contact 25, gate electrodes 4 are formed. The cylindrical capacitive cells are thus formed of the upper electrodes 12, capacitive insulating films 11, and lower electrodes 10.

The gate electrodes 4 are word lines, and electric charges accumulated in the capacitive cells are led to the outside by the control from the word lines. Also, the contact 20 disposed between a pair of capacitive cells in the DRAM range is formed of contact hole 20a penetrating the interlayer insulation film 5 in the direction of the thickness and metal plug 20b embedded in the contact hole 20a, and in the present embodiment, at the inner surface of the contact hole 20a, side wall insulating film 26 is formed, and furthermore, at the inner surface and bottom surface, metal barrier 21 is formed. Furthermore, the extending part 13 extending from the upper end of the upper electrode 12 in parallel to the substrate surface has a contact 20 side end part slightly separated from the contact 20.

Furthermore, a portion opposite to the contact 20 side of the extending part 13 extending from the upper electrode 12 is connected to an electric conductive layer having the same cylindrical structure as that of the capacitive cell formed of the lower electrode 10, the capacitive insulating film 11 and upper electrode 12. That is, the lower electrode 10 is formed inside, for example, a groove (or concave) having a rectangular section formed in the interlayer insulating film 5 so as to cover the bottom surface and side surface of the groove, however, near this capacitive cell, a groove, which has, for example, the same depth as that of the groove in which the lower electrode of the capacitive cell is formed, is formed, and inside this groove, an electric conductive layer 31 is formed. This groove is formed in the same process as the process for forming the capacitive cell groove, and the electric conductive layer 31 is formed in the same process as the process for forming the lower electrode 10. That is, the lower electrode 10 and electric conductive layer 31 are formed from the same material. On the bottom surface and side surface of the electric conductive layer 31 having a bottom and a cylindrical shape, in the same process as the upper electrode forming process, that is, from the same material, electric conductive layer 30 is formed.

Furthermore, at the center of the groove with the electric conductive layers 30 and 31 formed, a contact hole 32a reaching the conductive layer 30 is formed, and side wall insulating film 26 is formed at the inner surface of the contact hole 32a, and furthermore, at the inner surface and bottom surface, metal barrier 33 is formed, and Cu metal plug 32b is further embedded inside the metal barrier, whereby contact 32 is formed. This contact 32 is also connected to the wiring layer 6 on the interlayer insulation film 5.

Thereby, upper electrode 12 of each capacitive cell is connected to the contact 32 via the extending part 13 and electric conductive layer 30, and further connected to the wiring layer 6 via the contact 32. On the other hand, the lower electrode 10 is connected to the contact 20 via the impurity range 1, and further connected to the wiring layer 6 via the contact 20. Thereby, by the control from the gate electrodes 4, potentials between the wiring layer 6 and upper electrode 12 and lower electrode 10 of the capacitive cell are controlled, whereby accumulation and discharge of electric charges into and from the capacitive cell are controlled.

Figure 6:
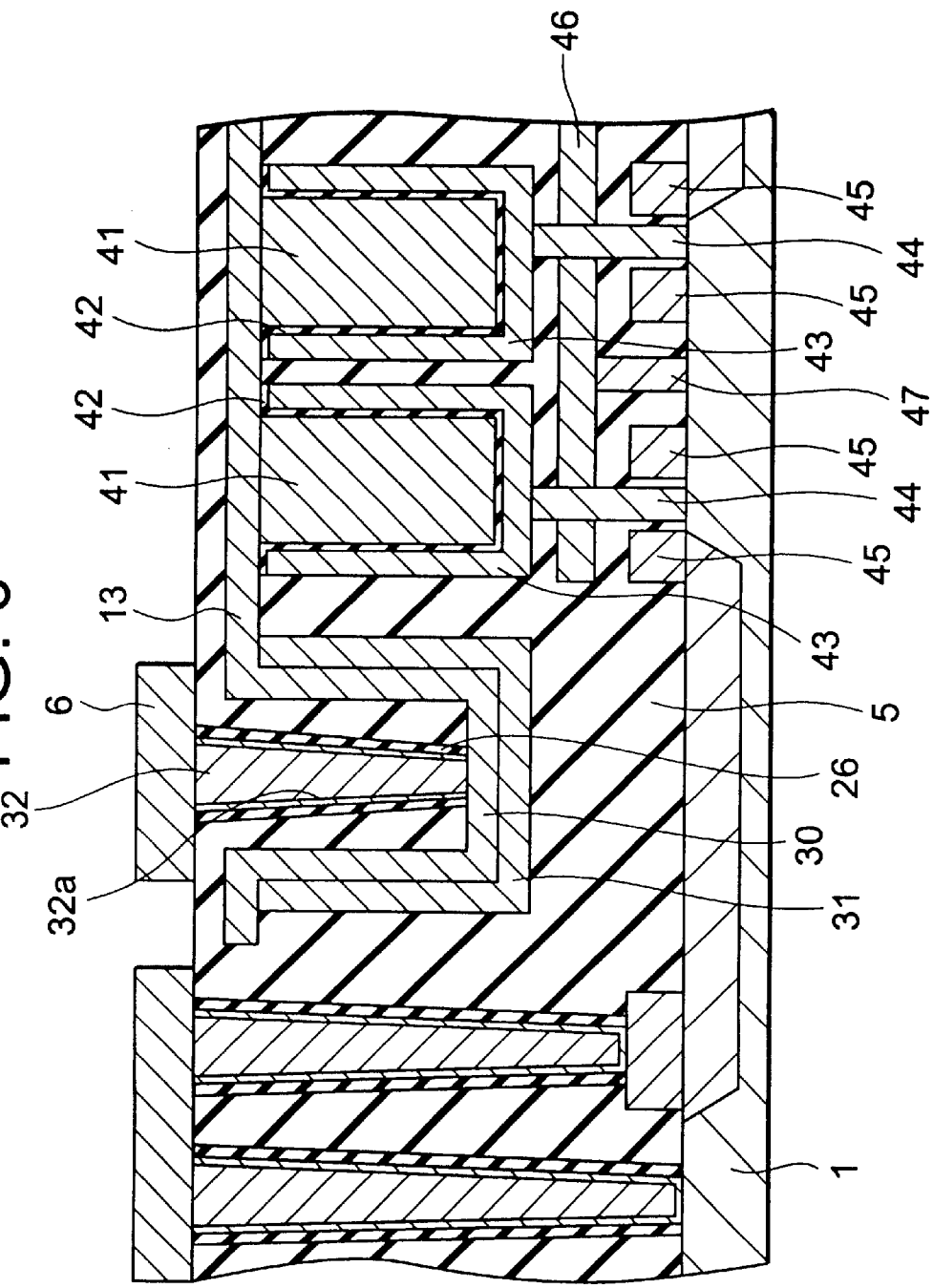
FIG. 6 is a sectional view showing the semiconductor memory device relating to the third embodiment of the invention.

In the present embodiment, the upper electrode contact 32 has a relatively great aspect ratio as that of the lower electrode contact 20 and peripheral circuit contact 7, and a difference in aspect ratio between the contact 20 and contact 32 is small. Therefore, for example, if the aspect ratio of the upper electrode contact 32 is 6, as shown in FIG. 6, the etching selecting ratio of $SiO_2$ and polysilicon is 35, extremely large. Therefore, in the contact hole etching process, the contact hole 32a, which is formed by being etched inside the $SiO_2$ film comprising the interlayer insulation film 5 from the surface of the interlayer insulation film 5, reaches a polysilicon film comprising the electric conductive layer 30, and the etching rate is significantly lowered. Therefore, at a point in time when the contact hole 32a reaches the conductive layer 30, although etching in the contact hole 20a is continued still, the progressing degree of etching in contact hole 32a is extremely small before the contact hole 20a reaches the impurity layer 1 on the substrate surface. Therefore, when etching for the contact hole 32a, the contact hole 32a is prevented, without fail, from penetrating the electric conductive layer 30, and also electric conductive layer 31. Also, since all contact holes have the same aspect ratio, the film thicknesses of the metal barriers to be formed on the bottom surfaces can be easily controlled, whereby metal barriers with even thicknesses can be formed. Accordingly, contact resistance can be made constant.

Figure 5:
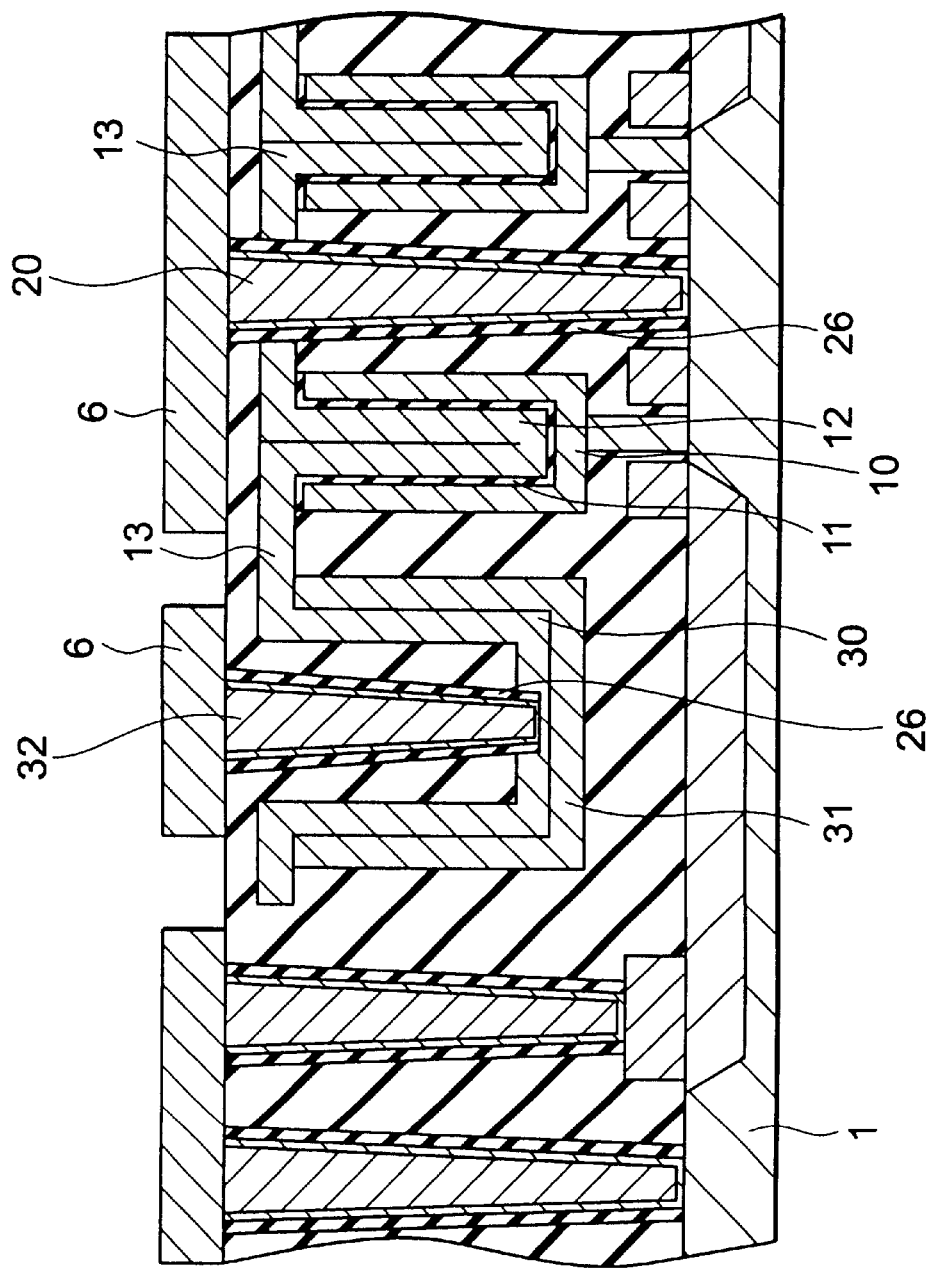
FIG. 5 is a sectional view showing the semiconductor memory device relating to the second embodiment of the invention.

FIG. 5 is a sectional view showing the portion including 2 capacitive cells of the DRAM device relating to the second embodiment of the invention. The point of difference of the present embodiment from the embodiment shown in FIG. 4 is in that, near the contact 20, the extending part 13 of the contact 20 side is contacted with the contact 20 via the side wall insulating film 26. That is, in the present embodiment, after the process for forming the upper electrode 12 and extending part 13, a process for selectively removing the extending part 13 near the contact 20 is not provided, and the contact hole 20a is formed to penetrate the extending part 13. In the present embodiment, since the side wall insulating film 26 is formed at the side surface of the contact 20, even if the portion of the extending part 13 near the contact 20 is not etched and removed, a short circuit between the extending part and contact does not occur.

Also in the present embodiment, since the aspect ratio of the upper electrode contact 32 is great, the same effect as in the embodiment shown in FIG. 4 is obtained.

Next, the third embodiment of the invention shall be described. FIG. 6 is a sectional view showing the DRAM portion of the semiconductor memory device relating to the third embodiment of the invention. The present embodiment differs from the first and second embodiments in the structure of the capacitive cell and the shape of the lower electrode contact. In the present embodiment, lower electrodes 43 each having a bottom and a cylindrical shape are formed within the interlayer insulation film 5, and at the inner side surfaces and inner bottom surfaces of the lower electrodes 43, capacitive insulating films 42 are formed. And, inside the lower electrodes 43, electric conductive substances are embedded to form upper electrodes 41. The upper electrodes 41 are contacted with the extending part 13 at the upper end faces, and therefore, the upper electrodes 41 are connected to electric conductive layers 30 and 31 each having a bottom and a cylindrical shape via the extending part 13 from the upper end faces, and led out to wiring layer 6 via contact 32. Therefore, the contact 32 for the upper electrodes 41 is connected to the bottoms of the conductive layers 30 and 31 having cylindrical structures as in the first and second embodiments, and the aspect ratio thereof is extremely large in comparison with that of the prior-art.

On the other hand, the lower electrodes 43 are connected to the impurity layer 1 on the semiconductor substrate surface by contacts 44, and gate electrodes 45 are formed at both sides sandwiching the contacts 44 on the surface of the impurity layer 1. And, on the surface of the impurity layer 1 between a pair of capacitive cells, contact 47 is formed, and this contact 47 is connected to bit wiring layer 46 embedded at a position lower than the capacitive cells within the interlayer insulation film 5.

In the semiconductor memory device of the present embodiment arranged as mentioned above, the wiring layer 46 embedded within the interlayer insulation film 5 functions as a bit line, and together with the gate electrodes 45 which function as word lines, controls accumulation and discharge of electric charges into and from the capacitive cells.

And, in the present embodiment, the lower electrodes 43 are not led out from the wiring layer on the interlayer insulation film 5, but are led out from the wiring layer 46 embedded below the capacitive cells within the interlayer insulation film 5. Therefore, it is not necessary to form contacts penetrating the thick interlayer insulation film 5. Also, in the manufacturing process, short circuits between the lower electrode contacts and upper electrode extending part 13 do not need to be taken into consideration. Also in the present embodiment, when openings for peripheral contacts are formed to penetrate the interlayer insulation film 5, openings for the upper electrode contacts 32 are simultaneously formed, and when these openings for the contacts 32 are formed, they do not penetrate the electric conductive layers 30 and 31.

Next, the manufacturing method for the semiconductor memory device of the invention shall be described. First, a manufacturing method for the semiconductor memory devices shown in FIG. 4 and FIG. 5 shall be described. In order to form the lower electrode 10 of the capacitive cell, a groove is formed within the interlayer insulation film 5, and when the lower electrode groove is formed, near said groove, a groove for the electric conductive layer 31 is formed. Therefore, the groove for the electric conductive layer 31 has the same depth as that of the lower electrode groove. Thereafter, in the process for forming the lower electrode 10, the electric conductive layer 31 is simultaneously formed. Also, in the process for forming the capacitive insulating film 11, the capacitive insulating film formed on the electric conductive layer 31 can be removed when removing the capacitive insulating films of the other portions, or left as it is. And, in the process for forming the upper electrode 12, the extending part 13 and electric conductive layer 30 are simultaneously formed. Then, after insulating films of SiO$_2$ or the like are embedded into the grooves, in the process for opening the upper electrode contact hole 20a and contact holes for the peripheral contacts 7, the contact hole 32a for the upper electrode contact 32 is simultaneously formed. Furthermore, at inner surfaces of all contact holes, side wall insulating films 26, metal barriers 33, and metal plugs 32b and 20b are formed, whereby the contacts 32, 20, and 7 are completed.

Next, a mask data preparing method in order to dispose capacitive electrodes and grooves shall be described. The width of a groove for forming the upper electrode contact 32 must be determined so as to secure a space larger than the diameter of the contact hole 32a even when the electric conductive layers 30 and 31 are formed in the groove.

Therefore, in order to form a cylinder (groove) having the above-mentioned formation, cylinder mask data is prepared by the following method. For automatic generation of mask data, in addition to the margins between the peripheral wiring and contacts in the prior-art, an operation for providing a contact into the upper electrode contact groove is required.

Therefore, when the diameter of the cross section of the contact 32 is x, and the thickness of the conductive layer 30 is y, by determining the product of x×y, only the contact data formed on the upper electrode conductive layer 30 is formed from the contact data.

Next, processing for adding the extracted data to cylinder data is carried out. Thereby, cylinder data in which cylinders are added into the contact forming range on the upper electrode conductive layer 30 in advance can be obtained.

If cylinder mask data is prepared by the above-mentioned method, a designer can design cylinder mask data without paying attention to the contact on the upper electrode conductive layer 30.

Furthermore, in the above-mentioned cylinder mask data preparing method, the contact data on the electric conductive layer 30 is automatically generated by means of a calculation. However, the present invention is not limited to this. The designer can directly input the contact data when preparing the cylinder data.

Next, the manufacturing method for the semiconductor memory device shown in FIG. 6 shall be described. As for the semiconductor memory device shown in FIG. 6, first, on the surface of the semiconductor substrate onto which the diffusion layer and gate electrodes are formed, the first interlayer insulation film is formed, the lower electrode 47 is formed in the first interlayer insulation film, and the upper electrode wiring 46 is formed on the first interlayer insulation film. Next, the second interlayer insulation film is formed on the first interlayer insulation film, and by both the first and second dielectrics, the interlayer insulation film 5 is formed. Thereafter, the capacitive cell grooves and upper electrode contact grooves are simultaneously formed in the second interlayer insulation film. Then, electric conductive substances are formed at the bottom surfaces and side surfaces of the capacitive cell grooves and upper electrode contact grooves to form lower electrodes 43 and first electric conductive layer 31. Next, at the inner side surfaces and bottom surfaces of the lower electrodes 43, capacitive insulating films 42 are formed. Thereafter, electric conductive substances are embedded into the capacitive cell grooves to form upper electrodes 41, and furthermore, an electric conductive substance layer is formed to form the second electric conductive layer 30 in the upper electrode contact groove, and upper electrode extending part 13 is simultaneously formed to connect the upper electrodes 41 and second electric conductive layer 30. Next, the upper electrode contact groove is filled with an insulation substance, and furthermore, in the insulation substance in the upper electrode contact groove, upper electrode contact hole 32a is formed, and an electric conductive substance is embedded into the upper electrode contact hole 32a to form the upper electrode contact 32.

As for the data generating method and disposing method of the upper electrode contact 32 for connection between the contact data and wiring layer 6 on the upper electrode extending part, by determining the product of the upper electrode contact data and upper electrode extending part, processing for extracting only the upper electrode contact data formed on the upper electrode extending part from the upper electrode contact data is carried out. Next, processing for adding the extracted data to the upper electrode contact groove data is carried out, whereby cylinder data of the upper electrode extending part is prepared, and the increased data is disposed with margins so as not to be contacted with the peripheral wiring.

First, the upper electrode contact 32 is overlapped on the upper electrode extending part, and only the contact data is extracted. Next, in order to prepare data of grooves to be opened in the interlayer insulation film to prevent a short circuit with the upper electrode in the groove, the contact data is added with the thickness of the side wall oxidized film 26 and the thickness of the interlayer insulation film 5.

Also, the dimensions of the upper electrode groove 32a are determined by the abovementioned method, and the groove 32a is formed at a position to prevent the outer circumference from being contacted with the adjacent pattern, for example, a position separating by approximately 0.18 μm as a minimum machining dimension. In this case, consideration is taken to prevent the entire circumference of the groove 32a from being contacted with the adjacent pattern.

As described above, according to the invention, the aspect ratio of the upper electrode contact is as great as that of the lower electrode contact and peripheral circuit contact, and is not greatly different from that of the other contacts. Therefore, the etching selecting ratio of the interlayer insulation film and the conductive layer of the upper electrode is great, penetration of the conductive layer when etching to form the upper electrode contact is prevented, and when a metal barrier is formed on the bottom surface of the upper electrode contact, the metal thickness can be controlled to be uniform, and the contact resistance at the contact can be controlled to be constant. Thereby, a reliable semiconductor memory device can be manufactured.

What is claimed is:

1. A manufacturing method for a semiconductor memory device comprising:

forming a diffusion layer and gate electrodes on the surface of a semiconductor substrate;

forming an interlayer insulation film on the surface of the semiconductor substrate;

simultaneously forming capacitive cell grooves and upper electrode contact grooves at the interlayer insulation film;

forming electric conductive substances at the bottom surfaces and side surfaces of the capacitive cell grooves and the upper electrode contact grooves to form lower electrodes and a first electric conductive layer, respectively;

forming capacitive insulating films at the inner side surfaces and bottom surfaces of the capacitive cell grooves and lower electrodes;

forming electric conductive substances within the capacitive cell grooves and upper electrode contact grooves to form upper electrodes and a second electric conductive layer, respectively, and simultaneously forming upper electrode extending parts connecting the upper electrodes and the second electric conductive layer;

embedding insulation substances into the upper electrode contact grooves;

simultaneously forming upper electrode contact holes and lower electrode contact holes in the insulation substances in the upper electrode contact grooves and interlayer insulation film, respectively, wherein the upper electrode contact holes extend into the upper electrode contact grooves more than one half of the depth of the grooves; and embedding electric conductive substances into the upper electrode contact holes and lower electrode contact holes to form upper electrode contacts and lower electrode contacts.

2. A manufacturing method for a semiconductor memory device comprising:

forming a diffusion layer and gate electrodes on the surface of a semiconductor substrate;

forming a first interlayer insulation film on the surface of the semiconductor substrate;

forming lower electrode contacts at the first interlayer insulation film and forming upper electrode wiring on the first interlayer insulation film;

forming a second interlayer insulation film on the first interlayer insulation film;

simultaneously forming capacitive cell grooves and upper electrode contact grooves at the second interlayer insulation film;

forming electric conductive substances at the bottom surfaces and side surfaces of the capacitive cell grooves and upper electrode contact grooves to form lower electrodes and a first electric conductive layer, respectively;

forming capacitive insulating films at the inner surfaces and bottom surfaces of the lower electrodes of the capacitive cell grooves;

embedding electric conductive substances into the capacitive cell grooves, wherein the upper electrode contact holes extend into the upper electrode contact grooves more than one half of the depth of the grooves to form upper electrodes;

forming electric conductive substances into the upper electrode contact grooves to form a second electric conductive layer and simultaneously forming upper electrode extending parts connecting the upper electrodes and the second electric conductive layer;

embedding insulation substances into the upper electrode contact grooves;

forming upper electrode contact holes in the insulation substances in the upper electrode contact grooves; and embedding electric conductive substances into the upper electrode contact holes to form upper electrode contacts.

3. A mask data preparing method, wherein, in a method for preparing groove data for the upper electrode contacts connecting the upper electrode extending parts of the semiconductor memory device manufactured according to the method of claim 1, comprising:

extracting only the contact data on the upper electrode extending parts by determining the product of the upper electrode contact data and extending parts; and adding a minimum insulation dimension to the extracted upper electrode contact data are provided.

4. A mask data preparing method, wherein, in a method for preparing groove data for the upper electrode contacts connecting the upper electrode extending parts and wiring layer of the semiconductor memory device manufactured according to the method of claim 2, comprising:

extracting only the contact data on the upper electrode extending parts by determining the product of the upper electrode contact data and extending parts; and adding a minimum insulation dimension to the extracted upper electrode contact data are provided.

5. A mask data preparing method according to claim 3, wherein in a method for disposing grooves at the upper electrode extending parts into which the upper electrodes are embedded by using the groove data and contact data, the electrode embedding grooves are spaced at a minimum dimension which does not cause a short circuit on the basis of the adjacent pattern, and disposed at a location nearest a memory cell cylinder.

6. A mask data preparing method according to claim 4, wherein in a method for disposing grooves at the upper electrode extending parts into which the upper electrodes are embedded by using the groove data and contact data, the electrode embedding grooves are spaced at a minimum dimension which does not cause a short circuit on the basis of the adjacent pattern, and disposed at a location nearest a memory cell cylinder.

* * * * *